United States Patent
Wang et al.

(10) Patent No.: US 10,095,058 B2
(45) Date of Patent: Oct. 9, 2018

(54) SHIFT REGISTER AND DRIVING METHOD THEREOF, GATE DRIVING DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Hui Wang, Beijing (CN); Jian Zhao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 3 days.

(21) Appl. No.: 15/740,121

(22) PCT Filed: May 4, 2017

(86) PCT No.: PCT/CN2017/083046
§ 371 (c)(1),
(2) Date: Dec. 27, 2017

(87) PCT Pub. No.: WO2017/211149
PCT Pub. Date: Dec. 14, 2017

(65) Prior Publication Data
US 2018/0188578 A1    Jul. 5, 2018

(30) Foreign Application Priority Data
Jun. 6, 2016 (CN) .......................... 2016 1 0395420

(51) Int. Cl.
*G11C 19/00* (2006.01)
*G02F 1/133* (2006.01)
(Continued)

(52) U.S. Cl.
CPC ........ *G02F 1/13306* (2013.01); *G02F 1/1343* (2013.01); *G09G 3/36* (2013.01);
(Continued)

(58) Field of Classification Search
None
See application file for complete search history.

(56) References Cited

U.S. PATENT DOCUMENTS

2007/0146289 A1    6/2007  Lee et al.
2011/0059640 A1*   3/2011  Su ....................... H01R 13/502
                                                   439/320
(Continued)

FOREIGN PATENT DOCUMENTS

CN    102945657 A    2/2013
CN    103996370 A    8/2014
(Continued)

OTHER PUBLICATIONS

CN Office Action for CN Application No. 201610395420.3, dated Dec. 25, 2017.
(Continued)

*Primary Examiner* — Tuan T Lam
(74) *Attorney, Agent, or Firm* — Foley & Lardner LLP

(57) ABSTRACT

Embodiments of the present disclosure relate to a shift register and its driving method, a gate driving device and its driving method. The shift register comprises an input module, a reset module, a control module, a pull-up module, a pull-down module, an output gating module and an output pull-down module. The input module can provide an input signal to the pull-up control node according to the input signal. The reset module can provide a first voltage signal to the pull-up control node according to a reset signal. The pull-up module can provide a first clock signal to the cascade node according to the voltage of the pull-up control node.

(Continued)

The control module can control the voltage of the pull-down control node according to the second clock signal and the voltage of the pull-up control node.

20 Claims, 11 Drawing Sheets

(51) Int. Cl.
    *G02F 1/1343* (2006.01)
    *G09G 3/36* (2006.01)
    *G11C 19/28* (2006.01)

(52) U.S. Cl.
    CPC ... *G09G 3/3677* (2013.01); *G09G 2310/0286* (2013.01); *G11C 19/28* (2013.01)

(56) References Cited

U.S. PATENT DOCUMENTS

| | | | |
|---|---|---|---|
| 2011/0148853 A1 | 6/2011 | Ko | |
| 2012/0139883 A1 | 6/2012 | Chen | |
| 2014/0019712 A1* | 1/2014 | Ould-Ahmed-Vall | G06F 9/30036 712/4 |
| 2014/0119492 A1* | 5/2014 | Liu | G11C 19/28 377/64 |
| 2014/0320175 A1* | 10/2014 | Li | G09G 3/3674 327/109 |
| 2015/0325181 A1* | 11/2015 | Wang | G09G 3/3677 377/64 |
| 2016/0111065 A1* | 4/2016 | Wang | G11C 19/28 345/213 |
| 2016/0125954 A1 | 5/2016 | Gu | |
| 2016/0267864 A1 | 9/2016 | Xiao | |
| 2016/0300623 A1 | 10/2016 | Yang et al. | |
| 2017/0364170 A1* | 12/2017 | Gu | G06F 3/041 |

FOREIGN PATENT DOCUMENTS

| | | |
|---|---|---|
| CN | 104008717 A | 8/2014 |
| CN | 104157259 A | 11/2014 |
| CN | 104332181 A | 2/2015 |
| CN | 104575419 A | 4/2015 |
| CN | 104715710 A | 6/2015 |
| CN | 105047172 A | 11/2015 |
| CN | 105096879 A | 11/2015 |
| CN | 105096902 A | 11/2015 |
| CN | 105938711 A | 9/2016 |
| KR | 20110035517 A | 4/2011 |
| KR | 20160024048 A | 3/2016 |

OTHER PUBLICATIONS

International Search Report and the Written Opinion of the International Searching Authority of Appl. No. PCT/CN2017/083046, dated Aug. 3, 2017, 14 pgs.

* cited by examiner

SHIFT REGISTER AND DRIVING METHOD THEREOF, GATE DRIVING DEVICE

CROSS REFERENCE TO RELATED APPLICATIONS

This application is a U.S. National Stage under 35 U.S.C. § 371 of PCT/CN2017/083046, filed on May 4, 2017, which claims priority to Chinese Application No. 201610395420.3 filed on Jun. 6, 2016, the disclosure of which is hereby incorporated by reference in its entirety as a part of this application.

FIELD OF THE DISCLOSURE

The present disclosure relates to the field of display technology, particularly to a shift register and its driving method, a gate driving device and its driving method, a display device.

BACKGROUND

The Gate driver On Array (GOA) technology is a technology of integrating a gate driving circuit (gate driver IC) on an array substrate. Current GOA circuits generally adopt a dot inversion driving mode or a column inversion driving mode. The dot inversion driving mode is preferred due to its better performance than the column inversion driving mode. Before a writing operation to pixels of display elements, precharging must be performed on the display elements. However, most of current GOA circuits are designed according to the column inversion driving mode. If a precharging mode corresponding to the column inversion driving mode is still used in the GOA unit in the precharging process, a difference in charging may occur between odd and even rows of the display elements, leading to inconsistent brightness and the occurrence of horizontal stripes, which may increase the power consumption of the source driving IC and decrease the quality of the products.

SUMMARY

To address the issue of a difference in charging between odd and even rows when precharging by current circuits of gate driver on array operating in the dot inversion driving mode, embodiments of the present disclosure provide a shift register and its driving method, a gate driving device and its driving method, and a display device.

According to one aspect of the present disclosure, a shift register is provided, comprising: an input module coupled to an input signal end and a pull-up control node, and configured to, according to an input signal from the input signal end, provide the input signal to the pull-up control node; a reset module coupled to a reset signal end, a first voltage signal end and the pull-up control node, and configured to, according to a reset signal from the reset signal end, provide a first voltage signal at the first voltage signal end to the pull-up control node to reset a voltage of the pull-up control node; a pull-up module coupled to a first clock signal input end, the pull-up control node, an output signal end and a cascade node, and configured to, according to the voltage of the pull-up control node, provide a first clock signal from the first clock signal input end to the cascade node; a control module coupled to a second clock signal input end, the pull-up control node, a pull-down control node, and the first voltage signal end, and configured to, according to a second clock signal from the second clock signal input end and the voltage of the pull-up control node, control a voltage of the pull-down control node; a pull-down module coupled to the pull-up control node, the pull-down control node, the first voltage signal end and the output signal end, and configured to, according to the voltage of the pull-down control node, provide the first voltage signal from the first voltage signal end to the pull-up control node and the output signal end to reset the voltage of the pull-up control node and the voltage of the output signal end; an output gating module coupled to the cascade node, the output signal end and a control signal end, and configured to, according to a control signal from the control signal end, provide a voltage of the cascade node to the output signal end as an output signal; and an output pull-down module coupled to the first voltage signal end, a start signal input end and the output signal end, and configured to, according to a start signal at the start signal input end, provide the first voltage signal from the first voltage signal end to the output signal end; wherein the first clock signal and the second clock signal have reverse phases.

In an embodiment of the present disclosure, the input module comprises a first transistor, wherein a first electrode and a control electrode of the first transistor are coupled to the input signal end, and a second electrode of the first transistor is coupled to the pull-up control node.

In an embodiment of the present disclosure, the reset module comprises a second transistor, wherein a first electrode of the second transistor is coupled to the pull-up control node, a second electrode of the second transistor is coupled to the first voltage signal end, and a control electrode of the second transistor is coupled to the reset signal end.

In the embodiment of the present disclosure, the pull-up module comprises a third transistor and a first capacitor. A first electrode of the third transistor is coupled to the first clock signal input end, a second electrode of the third transistor is coupled to the cascade node, and a control electrode of the third transistor is coupled to the pull-up control node. The first capacitor is coupled between the pull-up control node and the output signal end.

In the embodiment of the present disclosure, the control module comprises a fourth transistor, a fifth transistor, a sixth transistor and a seventh transistor. A first electrode and a control electrode of the fourth transistor are coupled to the second clock signal input end. A first electrode of the fifth transistor is coupled to the second clock signal input end, a second electrode of the fifth transistor is coupled to the pull-down control node, and a control electrode of the fifth transistor is coupled to a second electrode of the fourth transistor. A first electrode of the sixth transistor is coupled to the pull-down control node, a second electrode of the sixth transistor is coupled to the first voltage signal end, and a control electrode of the sixth transistor is coupled to the pull-up control node. A first electrode of the seventh transistor is coupled to the second electrode of the fourth transistor, a second electrode of the seventh transistor is coupled to the first voltage signal end, and a control electrode of the seventh transistor is coupled to the pull-up control node.

In the embodiment of the present disclosure, the pull-down module comprises an eighth transistor and a ninth transistor. A first electrode of the eighth transistor is coupled to the pull-up control node, a second electrode of the eighth transistor is coupled to the first voltage signal end, and a control electrode of the eighth transistor is coupled to the pull-down control node. A first electrode of the ninth transistor is coupled to the output signal end, a second electrode of the ninth transistor is coupled to the first voltage signal end, and a control electrode of the ninth transistor is coupled to the pull-down control node.

In an embodiment of the present disclosure, the output gating module comprises a tenth transistor, wherein a first electrode of the tenth transistor is coupled to the cascade node, a second electrode of the tenth transistor is coupled to the output signal end, and a control electrode of the tenth transistor is coupled to the control signal end.

In an embodiment of the present disclosure, the output pull-down module comprises an eleventh transistor, wherein a first electrode of the eleventh transistor is coupled to the output signal end, a second electrode of the eleventh transistor is coupled to the first voltage signal end, and a control electrode of the eleventh transistor is coupled to the start signal input end.

In the embodiment of the present disclosure, the shift register further comprises a noise reduction module, which is coupled to the second clock signal input end, the input signal end, the first voltage signal end and the output signal end, and is configured to, according to the second clock signal from the second clock signal input end, provide the input signal from the input signal end to the pull-up control node, and provide the first voltage signal from the first voltage signal end to the output signal end.

In the embodiment of the present disclosure, the noise reduction module comprises a twelfth transistor and thirteenth transistor. A first electrode of the twelfth transistor is coupled to the output signal end, a second electrode of the twelfth transistor is coupled to the first voltage signal end, and a control electrode of the twelfth transistor is coupled to the second clock signal input end. A first electrode of the thirteenth transistor is coupled to the input signal end, a second electrode of the thirteenth transistor is coupled to the pull-up control node, and a control electrode of the thirteenth transistor is coupled to the second clock signal input end.

According to another aspect of the present disclosure, a method for driving a shift register is further provided. In this method, during a first time period, an input signal is provided to an input module to turn on the input module, the input signal is outputted to a pull-up control node, a pull-up module is turned on according to a voltage of the pull-up control node, a first clock signal is provided to a cascade node, and a control module is turned on according to a voltage of the pull-up control node and a second clock signal to control a voltage of a pull-down control node. During a second time period, the pull-up module is kept in the turn-on state and a control signal is provided to an output gating module to turn on the output gating module, a first clock signal provided to the cascade node is outputted to the output signal end. During a third time period, a start signal is provided to the output pull-down module to turn on the pull-down module, a first voltage signal is outputted to the output signal end to reset a voltage of the output signal end. During a fourth time period, the pull-up module and the output gating module are turned on according to the voltage of the pull-up control node and a control signal and the first clock signal is outputted to the output signal end. During a fifth time period, a reset signal is provided to a reset module to turn on the reset module, the first voltage signal is provided to the pull-up control node, and the voltage of the pull-down control node is controlled by the control module to turn on the pull-down module, the first voltage signal is provided to the pull-up control node and the output signal end, so that the voltage of the pull-up control node and the voltage of the output signal end are reset.

In the embodiment of the present disclosure, during the first time period and the fifth time period, a second clock signal is further inputted to a noise reduction module to turn on the noise reduction module, so that the input signal is provided to the pull-up control node and the first voltage signal is provided to the output signal end.

According to another aspect of the present disclosure, a gate driving device is provided, comprising a plurality of shift registers, wherein the plurality of shift registers are divided in to N shift register stages, wherein each shift register stage comprises M shift registers, wherein a start signal input end of a first shift register at a first shift register stage is connected to an initial start signal, and a start signal input end of each of the other shift registers is coupled to an output signal end of a previous shift register. A cascade node of the jth shift register at the first shift register stage is coupled to an input signal end of the corresponding jth shift register at a second shift register stage, and a cascade node of the jth shift register at other shift register stage is coupled to a reset signal end of the corresponding jth shift register at a previous shift register stage and an input signal end of the corresponding jth shift register at a next shift register stage respectively, the input signal end of each shift register at the first shift register stage is connected to an input signal. A first clock signal input end of the jth shift register at each shift register stage is connected to a second clock signal input end of the jth shift register at an adjacent shift register stage. A control signal end of the (2i−1)th shift register is connected to a first control signal, and a control signal end of the (2i)th shift register is connected to a second control signal. A first voltage signal end of each shift register is connected to a first voltage signal.

According to another aspect of the present disclosure, a gate driving device is provided, comprising a plurality of shift registers, wherein the plurality of shift registers are divided in to N shift register stages, wherein each shift register stage comprises M shift registers, wherein a start signal input end of a first shift register at a first shift register stage is connected to an initial start signal, and a start signal input end of each of the other shift registers is coupled to an output signal end of a previous shift register. A cascade node of the jth shift register at the first shift register stage is coupled to an input signal end of the corresponding jth shift register at a second shift register stage, and a cascade node of the jth shift register at other shift register stage is coupled to a reset signal end of the corresponding jth shift register at a previous shift register stage and an input signal end of the corresponding jth shift register at a next shift register stage respectively, the input signal end of each shift register at the first shift register stage is connected to an input signal. A first clock signal input end of the jth shift register at each shift register stage is connected to a second clock signal input end of the jth shift register at an adjacent shift register stage. The control signal ends of the (2i−1)th and 2ith shift registers are connected to a first control signal, and the control signal ends of the (2i+1)th and (2i+2)th shift registers are connected to a second control signal. The first voltage signal end of each shift register is connected to a first voltage level signal.

According to another aspect of the present disclosure, a gate driving device is provided, comprising a plurality of shift registers, wherein the plurality of shift registers are divided in to N shift register stages, wherein each shift register stage comprises M shift registers, wherein a start signal input end of a first shift register at a first shift register stage is connected to an initial start signal, and a start signal input end of each of the other shift registers is coupled to an output signal end of a previous shift register. A cascade node of the jth shift register at the first shift register stage is coupled to an input signal end of the corresponding jth shift register at a second shift register stage, and a cascade node of the jth shift register at other shift register stage is coupled to a reset signal end of the corresponding jth shift register at a previous shift register stage and an input signal end of the corresponding jth shift register at a next shift register stage respectively, the input signal end of each shift register at the first shift register stage is connected to an input signal. A first clock signal input end of the jth shift register at each shift register stage is connected to a second clock signal input end of the jth shift register at an adjacent shift register stage. The control signal ends of the (3i−2)th, (3i−1)th, (3i+1)th and (3i+2)th shift registers are connected to a first control signal, and the control signal ends of the (3i)th and (3i+3))th shift registers are connected to a second control signal. The first voltage signal end of each shift register is connected to a first voltage signal.

In the embodiment of the present disclosure, a forward clock signal and a reverse clock signal of the gate driving device are DC signals.

In the embodiment of the present disclosure, the forward clock signal and the reverse clock signal of the gate driving device are AC signals.

According to another aspect of the present disclosure, a display device comprising the above shift register is provided.

According to another aspect of the present disclosure, a display device comprising the above gate driving device is provided.

According to another aspect of the present disclosure, a method for driving a gate driving device is provided. In this method, during a first time period, by the effect of an input signal, a first clock signal is provided to a cascade node and is used as an input signal for a corresponding shift register at a next shift register stage. During a second time period, by the effect of a control signal, the first clock signal provided to the cascade node is outputted to an output signal end as an output signal. During a third time period, the outputting of the output signal is stopped by the effect of a control signal and the output signal is reset by the effect of an output signal of a previous shift register. During a fourth time period, by the effect of a control signal, the output signal is outputted. During a fifth time period, by the effect of an output signal of a next shift register, the output signal is reset. Wherein, when an odd numbered shift register is in the fourth time period, a subsequent odd numbered shift register is in the second time period, and when an even numbered shift register is in the fourth time period, a subsequent even numbered shift register is in the second time period.

According to the shift register and the method thereof, the gate driving device and the method thereof and the display device provided in the embodiments of the present disclosure, a control signal end for inputting a control signal T, a STV input end and a cascade node P1 are added, the control signal (T) is received by an output gating module to selectively output the output signal of a shift register and the output signal of a previous shift register is received by the output pull-down module to prevent inconsistent brightness and horizontal stripes caused by a difference in charging between odd and even rows when precharging row-by-row by the gate driving device operating in the dot inversion driving mode, so that the power consumption of the source driving IC can be reduced and the quality of the products can be improved.

BRIEF DESCRIPTION OF THE DRAWINGS

A complete understanding of the contents of the present disclosure may be obtained from the description of the following embodiments when read in conjunction with the accompanying drawings, in which.

DETAILED DESCRIPTION

Below, a clear and complete description will be given for the technical solution of embodiments of the present disclosure with reference to the figures of the embodiments. It should be understood that the specific embodiments of the present disclosure are merely illustrative embodiments, and are not used for limiting the protection scope of the present disclosure.

In the following description, unless otherwise specified, the term "connect/couple" means that an element is coupled to another element or elements "directly" or "indirectly" through one or more other elements.

A liquid crystal display panel is mainly composed of gates, sources and a matrix. Wherein, a gate driving circuit outputs a gate scanning signal, which activates TFT gates in the panel by rows to enable conduction between the source and drain, so that corresponding charges can be written into the pixels to achieve the purpose of displaying. The gate driving circuit is used to generate a gate scanning voltage.

The Gate driver On Array (GOA) technology is a technology of integrating a gate driving circuit on an array substrate. Each GOA unit, serving as a shift register for controlling a corresponding row of display elements (e.g., thin film transistor (TFT)), corresponds to a row of TFT gates, which activates TFT gates sequentially to complete a pixel writing operation. The GOA circuit is composed of a plurality of GOA units connected in cascade with each other.

Figure 1:
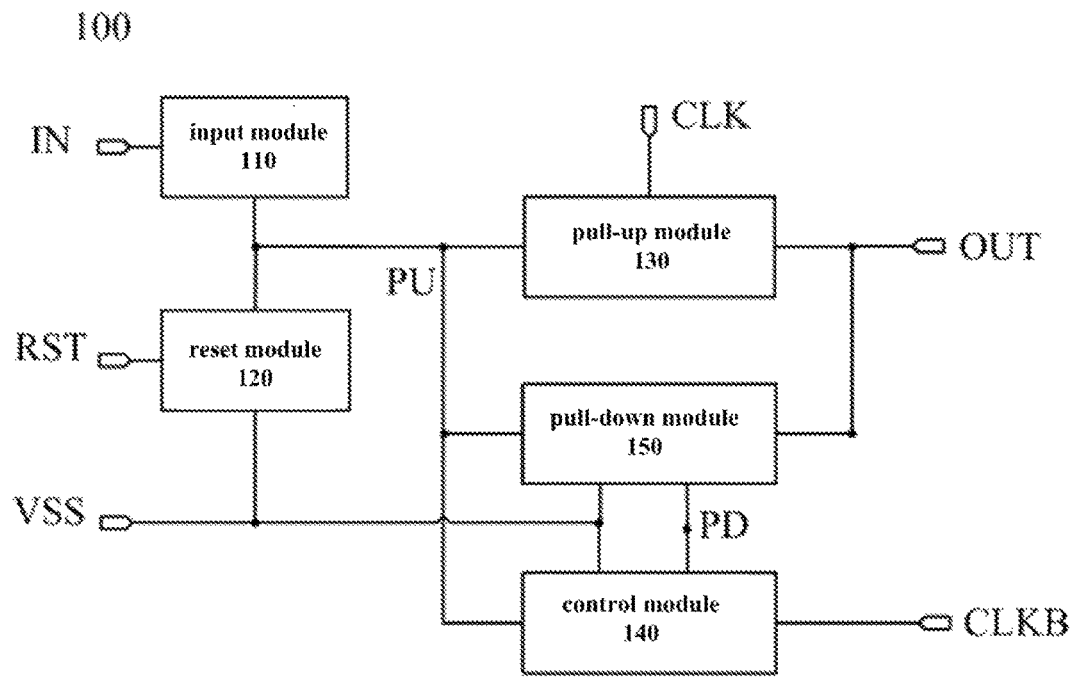
FIG. 1 shows a schematic block diagram of a shift register in the prior art.

FIG. 1 shows a schematic block diagram of a shift register 100 in the prior art. As shown in FIG. 1, the shift register 100 may comprise: an input module 110, a reset module 120, a pull-up module 130, a control module 140 and a pull-down module 150.

The input module 110 is connected to an input signal end IN and a pull-up control node PU, and is configured to, by the effect of an input signal at the input signal end IN, provide the input signal to the pull-up control node.

The reset module 120 is connected to a reset signal end RST, a first voltage signal end VSS and the pull-up control node PU, and is configured to, by the effect of a reset signal RESET, provide a first voltage signal at the first voltage signal end to the pull-up control node PU to reset a voltage of the pull-up control node PU.

The pull-up module 130 is connected to a first clock signal input end CLK, the pull-up control node PU, and an output signal end OUT, and is configured to, according to the voltage of the pull-up control node PU, provide a first clock signal at the first clock signal input end CLK to the output signal end OUT as an output signal.

The control module 140 is connected to a second clock signal input end CLKB, the pull-up control node PU, a pull-down control node PD, and the first voltage signal end VSS, and is configured to, according to a second clock signal from the second clock signal input end CLKB and the voltage of the pull-up control node PU, control a voltage of the pull-down control node PD.

The pull-down module 150 is connected to the pull-up control node PU, the pull-down control node PD, the first voltage signal end VSS and the output signal end OUT, and is configured to, under the control of the voltage of the pull-down control node PD, provide the first voltage signal at the first voltage signal end VSS to the pull-up control node PU and the output signal end OUT to reset the voltage of the pull-up control node and the voltage of the output signal end.

Figure 2:
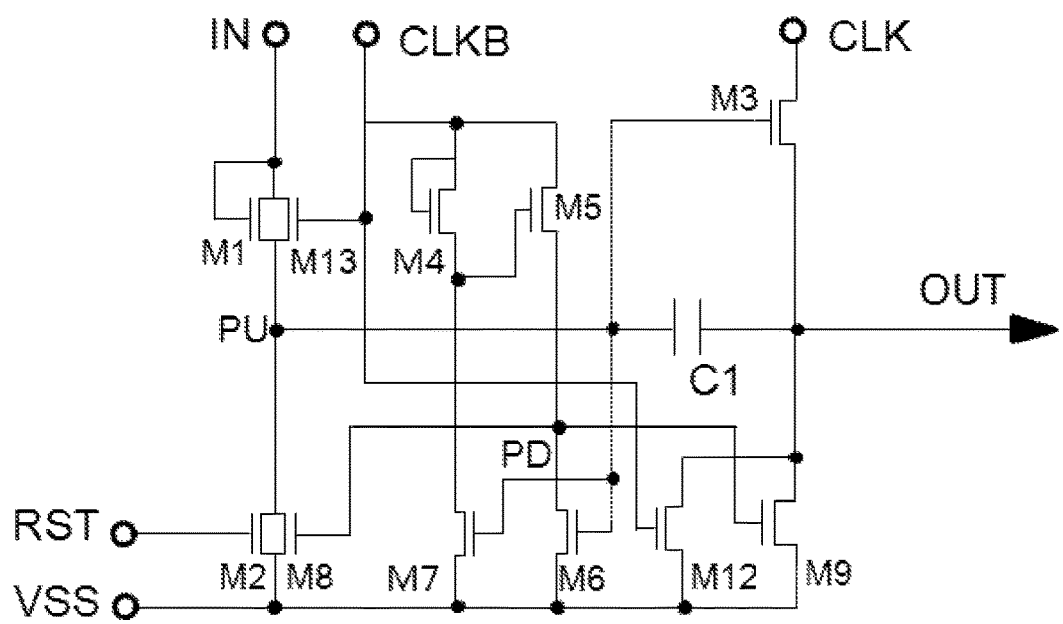
FIG. 2 shows an exemplary circuit diagram of the shift register shown in FIG. 1.

FIG. 2 shows an exemplary circuit diagram of the shift register 100 shown in FIG. 1. The transistors adopted in this embodiment may be N-type transistors or P-type transistors. Particularly, the transistors may be N-type or P-type field effect transistors (MOS) or N-type or P-type or N type bipolar transistors (BJT). In the embodiment of the present disclosure, the gate of a transistor is referred to as its control electrode. Since the source and drain of a transistor are symmetric to each other, it is not necessary to distinguish the source from the drain, i.e., the source of the transistor is its first electrode (or a second electrode), and the drain of the transistor is its second electrode (or first electrode). Further, any controlled switch element having a gating signal input can be used to serve the function of a transistor, a controlled intermediate end for receiving a control signal (for example, to turn on/off the controlled switch element) of the switch element is referred to as its control electrode, and other two ends thereof are the first electrode and the second electrode respectively. Hereinafter, a description will be given in detail with N-type transistors as an example.

Refer to the combination of FIGS. 1 and 2, the input module 110 comprises a first transistor M1. The first electrode and control electrode of the first transistor M1 are connected to the input signal end IN respectively, and the second electrode thereof is connected to the pull-up control node PU.

The reset module 120 comprises a second transistor M2. The first electrode of the second transistor M2 is connected to the pull-up control node PU, with its second electrode connected to the first voltage signal end VSS, and its control electrode connected to the reset signal end RST.

The pull-up module 130 comprises a third transistor M3 and a capacitor C1. The first electrode of the third transistor M3 is connected to the first clock signal input end CLK, with its second electrode connected to the output signal end OUT, and its control electrode connected to the pull-up control node PU. The capacitor C1 as an energy storage element is used to maintain a voltage difference generated by the input signal, its first electrode is connected to the pull-up control node PU and its second electrode is connected to the output signal end OUT.

The control module 140 comprises a fourth transistor M4, a fifth transistor M5, a sixth transistor M6 and a seventh transistor M7. The first electrode and the control electrode of the fourth transistor M4 are both connected to the second clock signal input end CLKB. The first electrode of the fifth transistor M5 is connected to the second clock signal input end CLKB, with its second electrode connected to the pull-down control node PD, and its control electrode connected to the second electrode of the fourth transistor M4. The first electrode of the sixth transistor M6 is connected to the pull-down control node PD, with its second electrode connected to the first voltage signal end VSS, and its control electrode connected to the pull-up control node PU. The first electrode of the seventh transistor M7 is connected to the second electrode of the fourth transistor M4, with its second electrode connected to the first voltage signal end VSS, and its control electrode connected to the pull-up control node PU.

The pull-down module comprises an eighth transistor M8 and a ninth transistor M9. The first electrode of the eighth transistor M8 is connected to the pull-up control node PU, with its second electrode connected to the first voltage signal end VSS, and its control electrode connected to the pull-down control node PD. The first electrode of the ninth transistor M9 is connected to the output signal end OUT, with its second electrode connected to the first voltage signal end VSS, and its control electrode connected to the pull-down control node PD.

Optionally, the shift register 100 may further comprise a noise reduction module, which is connected to the second clock signal input end CLKB, the input signal end IN, the first voltage signal end VSS and the output signal end OUT, and is configured to, by the effect of the second clock signal CLKB, provide the input signal from the input signal end IN to the pull-up control node PU, and provide the first voltage signal from the first voltage signal end VSS to the output signal end, to reduce noises in the voltage of the pull-up control node PU and the output signal.

As shown in FIG. 2, the noise reduction module comprises a twelfth transistor M12 and thirteenth transistor M13. The first electrode of the twelfth transistor M12 is connected to the output signal end OUT, with its second electrode connected to the first voltage signal end VSS, and its control electrode connected to the second clock signal input end CLKB. The first electrode of the thirteenth transistor M13 is connected to the input signal end IN, with its second electrode connected to the pull-up control node PU, and its control electrode connected to the second clock signal input end CLKB.

The first clock signal and the second clock signal of the shift register have the same signal cycle but opposite phases, and a duty cycle can be selected as 50% or other value.

When a plurality of shift registers shown in FIG. 2 are connected in cascade as a gate driving device, an initial start signal STV is inputted to the input signal end IN of a first shift register, and the input signal end IN of other shift register is connected to the output signal end OUT of a previous shift register, with its reset signal end RST connected to the output signal end OUT of a next shift register.

Figure 3:
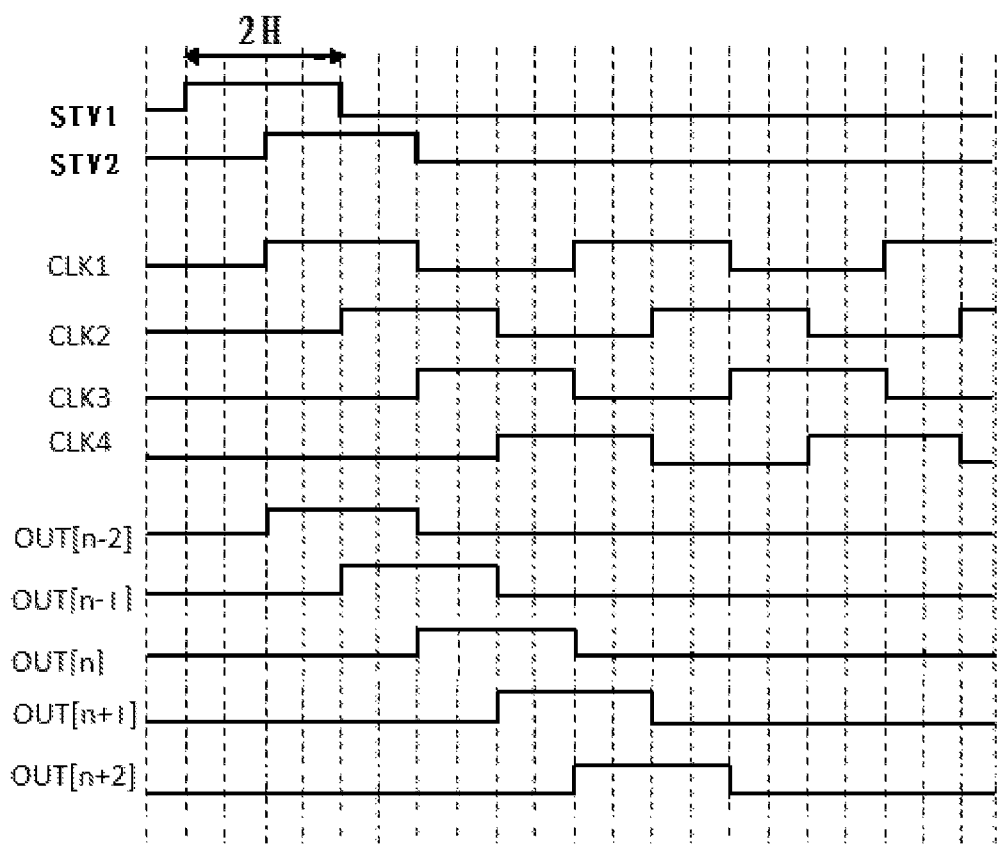
FIG. 3 shows a timing diagram of various signals of the gate driving device using the shift register shown in FIG. 2.

FIG. 3 shows a timing diagram for driving a gate driving device constructed by cascading shift registers shown in FIG. 2. As shown in FIG. 3, a first initial start signal STV1 and a second start signal STV2 respectively represent the initial start signals of a first shift register and a second shift register, i.e., initial start signals of an odd row and an even row.

In order to guarantee a sufficient period for increasing the voltage level of the pull-up control node PU, so that the PU pull-up period exceeds a period required for charging the gates of display elements in a row, a high voltage level must be kept for a certain period. In FIG. 3, a period required for charging the gates of the display elements is 1H, and a period during which STV1 and STV2 are remained at a high level is 2H (>1H).

For the sake of satisfying the requirement of high resolution, there is an overlap in time between precharging and data writing of adjacent rows (turning on/off the display elements). The first and second clock signals of shift registers in an odd row are CLK1 and CLK3 respectively, and the first and second clock signals of shift registers in an even row are CLK2 and CLK4 respectively. The array gate driving signals outputted from the output signal ends OUT of the shift registers in odd rows (1, 3, 5 rows) are represented by OUT[n−2], OUT[n] and OUT[n+2], and the array gate driving signals outputted from the output signal ends OUT of the shift registers in even rows (2, 4 rows) are represented by OUT[n−1], OUT [n+1].

The gate driving device generally adopts a column inversion driving mode and a dot inversion driving mode.

In the column inversion driving mode, display elements located in different rows of the same column have the same polarity of source driving voltage at the same time time, i.e., in one driving circle, when a pixel writing operation is performed on display elements in a current row, precharging can be performed on display elements in the same column simultaneously for a plurality of subsequent rows, such as the second row, the third row and so on. However, column inversion driving has a drawback of the appearance of blur.

Interlaced precharging is used in dot inversion driving mode to overcome the drawback of the column inversion driving mode. Dot inversion driving includes single-dot (1 dot) inversion, double-dot (2dot) inversion, 2+1dot inversion, etc. In single-dot inversion, polarities of display elements in the same column are arranged in a positive-negative alternate pattern (+−+−), in 2dot inversion display elements in the same column have a polarity pattern (++−−++−−), and in 2+1dot inversion, the polarity pattern is (++−++−).

In the single-dot inversion driving mode, display elements located in different rows of the same column have alternately opposite polarity of the source driving voltage at the same time, i.e., display elements located in odd rows of the column have the same polarity, and display elements located in even rows of the column have polarity opposite to that of the odd rows.

Since the dot inversion driving mode adopts interlaced precharging, its cascading mode must be adjusted correspondingly. When cascading, an initial start signal STV1 is inputted to the input signal end IN of a first shift register SR1, an initial start signal STV2 is inputted to the input signal end IN of a second shift register SR2. Wherein, the output signal ends OUT of shift registers located in a odd row are connected to the input signal ends IN of shift registers located in a next odd row, and the output signal ends OUT of shift registers located in an even row are connected to the input signal ends IN of shift registers located in a next even row. The reset signal end RST of the first shift register SR1 is connected to a reset signal, and the reset signal end RST of each subsequent shift register is connected to the output signal end OUT of its previous shift register.

If the precharging mode corresponding to column inversion driving is still used to precharge the shift registers, for display elements in the same column at one moment, when display elements in odd rows are in a precharging state, display elements in even rows cannot be precharged due to their opposite polarity, and when charging the odd rows at a next moment, it is necessary to reset the circuit of gate driver on array from a high voltage level, and reverse polarity and change to an opposite high voltage level, which will cause that the display elements in odd rows and even rows have inconsistent brightness due to a difference in precharging. Because reversing the driving voltage polarity takes a longer time, the power consumption of the source driving IC will be increased and the quality of the products will be reduced.

In view of this problem, the present disclosure provides an improved shift register structure and introduces a concept of shift register stage for the cascading of a plurality of shift registers. A plurality of shift registers can be divided into a plurality of sets each including the same number of shift registers. Each set of shift registers is referred as a shift register stage. Each shift register stage includes M shift registers, wherein M is a natural number, M≥2. The selection of M corresponds to an M-row precharging mode, which means that, in one gate driving circle, when a pixel writing operation is performed on display elements in a current row, precharging can be performed on display elements in subsequent (M−1) rows.

Figure 4:
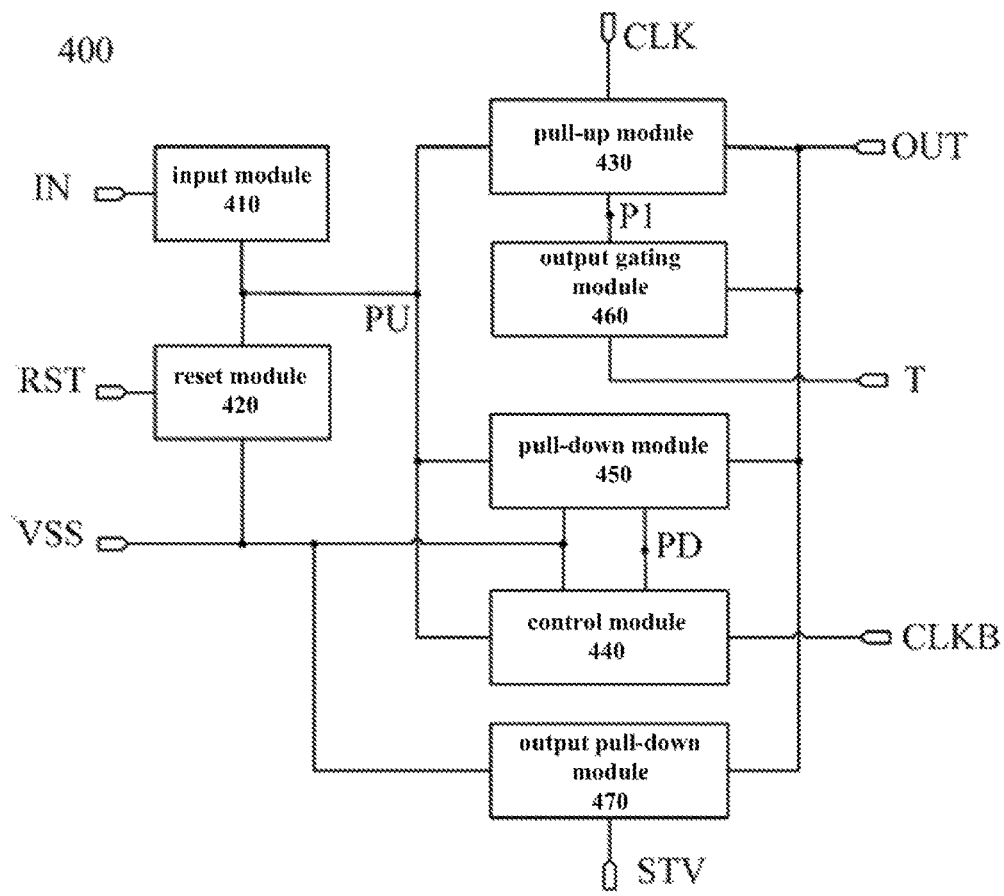
FIG. 4 shows a schematic block diagram of a shift register according to an embodiment of the present disclosure.

FIG. 4 shows a schematic block diagram of a shift register 400 according to an embodiment of the present disclosure. As shown in FIG. 4, a shift register 400 may comprise an input module 410, a reset module 420, a pull-up module 430, a control module 440, a pull-down module 450, an output gating module 460 and an output pull-down module 470. In the embodiment of the present disclosure, the input module 410, the reset module 420, the control module 440 and the pull-down module 450 correspondingly have the same structures and functions as the input module 110, the reset module 120, the control module 140 and the pull-down module 150 in FIG. 1, which will not be described in detail herein. Below, a particular description will be given to the structures and functions of those modules that are different from that of the shift register 100 shown in FIG. 1.

The pull-up module 430 is connected to the first clock signal input end CLK, the pull-up control node PU, the output signal end OUT and the cascade node P1, and is configured to, according to a voltage of the pull-up control node PU, provide a first clock signal at the first clock signal input end CLK to the cascade node P1.

The output gating module 460 is connected to the cascade node P1, the output signal end OUT and the control signal end T, and is configured to, by the effect of a control signal at the control signal end T, provide the voltage of the cascade node P1 to the output signal end.

The output pull-down module 470 is connected to the first voltage signal end VSS, the start signal input end STV and the output signal end OUT, and is configured to, by the effect of a start signal at the start signal input end STV, provide the first voltage signal at the first voltage signal end to the output signal end OUT.

Figure 5:
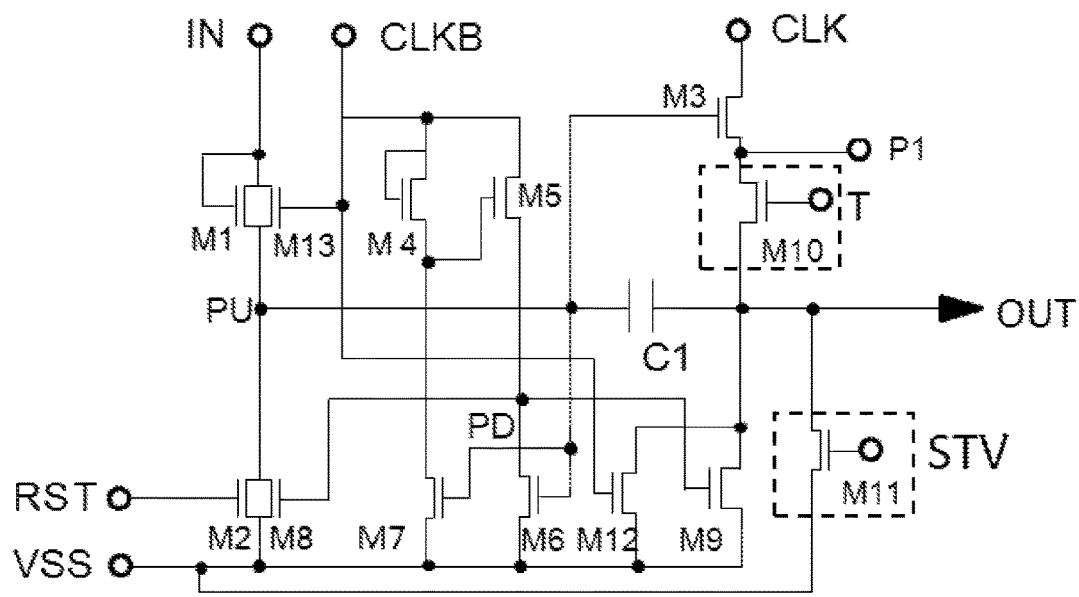
FIG. 5 shows an exemplary circuit diagram of the shift register shown in FIG. 4.

FIG. 5 shows an exemplary circuit diagram of the shift register 400 shown in FIG. 4. The circuit structure shown in FIG. 5, which is similar to that of FIG. 2, mainly differs in the structure of the pull-up module 430, and a newly added output gating module 460 and an output pull-down module 470. Hereinafter, a description will be given in detail with N-type transistors as an example to describe the different circuit structure.

As for the pull-up module 430, the first electrode and the control electrode of the third transistor M3 are still connected to the first clock signal input end CLK and the pull-up control node PU, and its second electrode is connected to the cascade node P1.

The output gating module 460 comprises a tenth transistor M10. The first electrode of the tenth transistor M10 is connected to the cascade node P1, with its second electrode connected to the output signal end OUT, and its control electrode connected to the control signal end T.

The output gating module 470 comprises an eleventh transistor M11. The first electrode of the eleventh transistor M11 is connected the output signal end OUT, with its second electrode connected to the first voltage signal end VSS, and its control electrode connected to the start signal input end STV.

Figure 6:
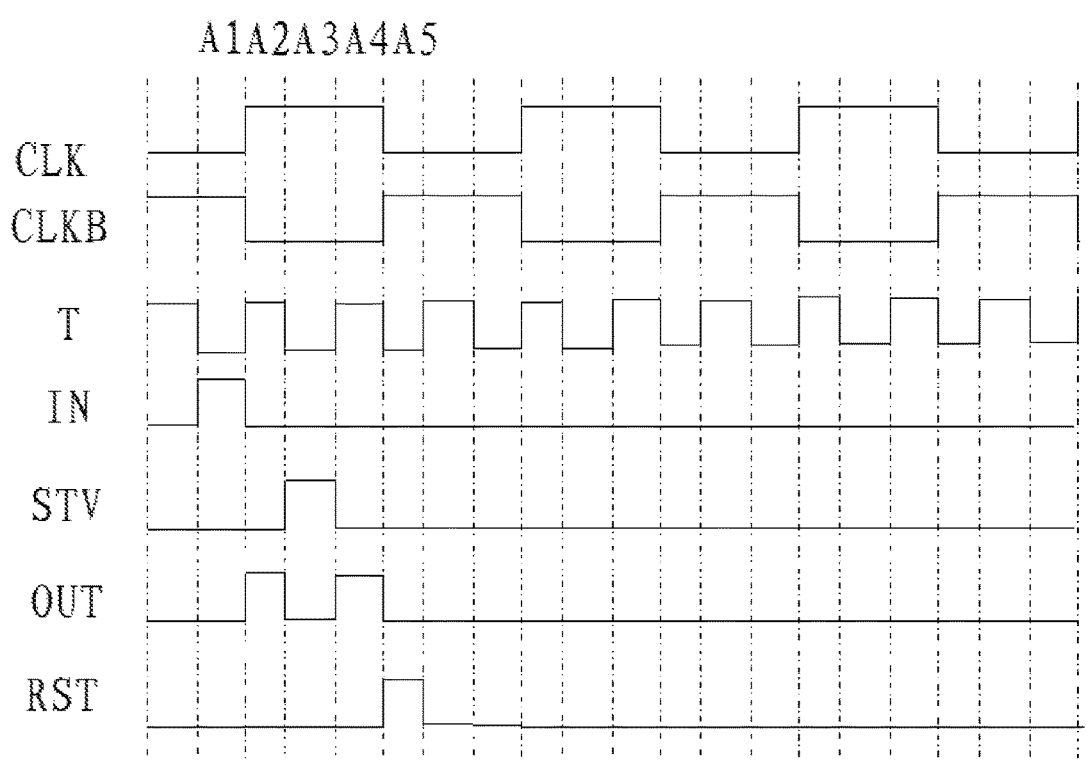
FIG. 6 shows a timing diagram of various signals of the shift register shown in FIG. 5.

Now, the operation process of the shift register 400 of FIG. 5 will be described in detail according to the timing diagram shown in FIG. 6. In the following description, as an example, all the transistors included in the shift register are N type transistors. In the embodiment of the present disclosure, a low voltage level signal is applied to the first voltage signal end.

During the time period A1 (input phase), the first clock signal CLK is at a low voltage level, the second clock signal CLKB is at a high voltage level, the control signal T is at a low voltage level, and the input signal IN is at a high voltage level. During A1, the first transistor M1 and the thirteenth transistor M13 are turned on, so that the voltage of the pull-up control node PU increases to a high voltage level to charge the capacitor C1. The twelfth transistor M12 is turned on, the first voltage signal at a low voltage level is outputted to the output signal end OUT, and the output signal end OUT outputs a low voltage level signal. In addition, the third transistor M3 is turned on, the tenth transistor M10 is turned off, so that the output signal end OUT is not affected by the first clock signal output end CLK. On the other hand, the fourth transistor M4, the sixth transistor M6 and the seventh transistor M7 are turned on, by controlling the width-to-length ratio (W/L) of the fourth transistor M4 and the seventh transistor M7, the fifth transistor M5 is turned on, and the voltage of the pull-down control node PD becomes at a low voltage level to guarantee a stable signal output.

During the time period A2 (precharging phase), the first clock signal CLK is at a high voltage level, the second clock signal CLKB is at a low voltage level, the control signal T is at a high voltage level, and the input signal IN is at a low voltage level. The first transistor M1 and the thirteenth transistor M13 are turned off, the voltage of the pull-up control node PU is further pulled up by bootstrapping, and the transistor M3 is kept in the turn-on state. Further, the tenth transistor M10 is turned on, a high voltage level signal from the first clock signal input end CLK is provided to the cascade node P1, and is further outputted to the output signal end OUT, i.e., the output signal end OUT outputs an output signal used for driving a gate line.

During the time period A3 (first reset phase), the first clock signal CLK is at a high voltage level, the second clock signal CLKB is at a low voltage level, the control signal T is at a low voltage level, and the start signal STV is at a high voltage level. The tenth transistor M10 is turned off and stops outputting the first clock signal CLK to the output signal end OUT. The fifteenth transistor M15 is turned on to keep the output signal end OUT at a low voltage level.

During the time period A4 (pixel writing phase), the first clock signal CLK is at a high voltage level, the second clock signal CLKB is at a low voltage level, the control signal T is at a high voltage level, and the start signal STV is at a low voltage level. The tenth transistor M10 is turned on and the output signal end OUT outputs a high voltage level signal again.

During the time period A5 (second reset phase), the first clock signal CLK is at a low voltage level, the second clock signal CLKB is at a high voltage level, the control signal T is at a low voltage level, and the reset signal RST is at a high voltage level. The second transistor M2 is turned on, and the voltage of the pull-up control node decreases to a low voltage level. The fourth transistor M4 and the fifth transistor M5 are turned on and the voltage of the pull-down control node increases to a high voltage level. The eighth transistor M8 and the ninth transistor M9 are turned on to keep the output signal end OUT at a low voltage level. Further, the twelfth transistor M12 is turned on to guarantee a stable signal output.

Figure 7:
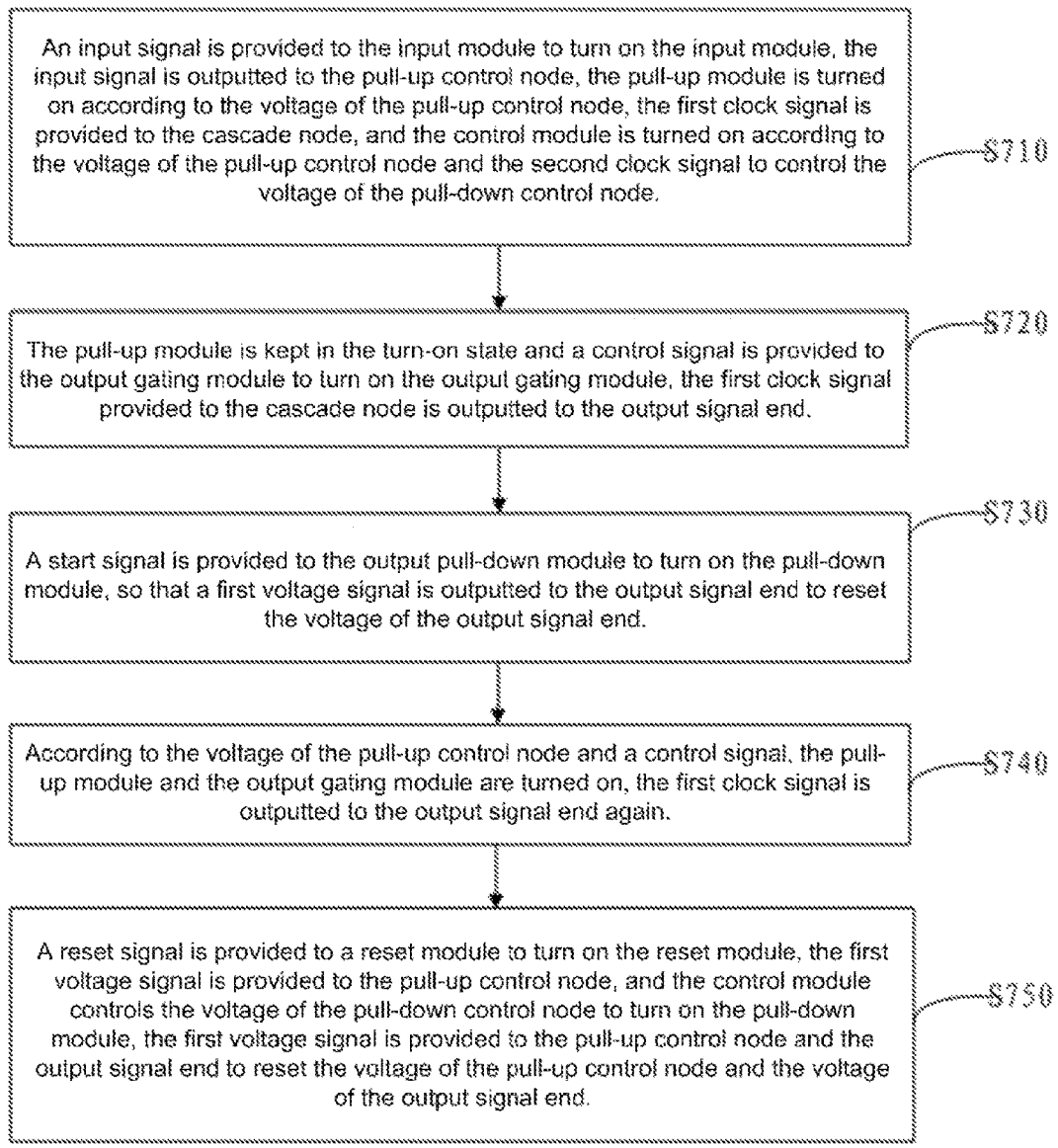
FIG. 7 shows an exemplary flowchart of a method for driving the shift register shown in FIG. 5.

FIG. 7 shows an exemplary flowchart of a method for driving the shift register 400 shown in FIG. 4 according to an embodiment of the present disclosure.

At step S710, an input signal IN is provided to the input module 410 to turn on the input module 410, the input signal is outputted to the pull-up control node PU, the pull-up module 430 is turned on according to the voltage of the pull-up control node PU, the first clock signal CLK is provided to the cascade node P1, and the control module 440 is turned on according to the voltage of the pull-up control node PU and the second clock signal CLKB to control the voltage of the pull-down control node PD.

At step S720, the pull-up module 430 is kept in the turn-on state and a control signal T is provided to the output gating module 460 to turn on the output gating module 460, and the first clock signal CLK provided to the cascade node P1 is outputted to the output signal end OUT.

At step S730, a start signal STV is provided to the output pull-down module 470 to turn on the pull-down module 470, so that a first voltage signal VSS is outputted to the output signal end OUT to reset the voltage of the output signal end OUT.

At step S740, the pull-up module 430 and the output gating module 460 are turned on according to the voltage of the pull-up control node PU and a control signal T, the first clock signal CLK is outputted to the output signal end OUT again.

At step S750, a reset signal RST is provided to a reset module 420 to turn on the reset module 420, the first voltage signal VSS is provided to the pull-up control node PU, and the control module 440 controls the voltage of the pull-down control node PD to turn on the pull-down module 450, the first voltage signal VSS is provided to the pull-up control node PU and the output signal end OUT to reset the voltage of the pull-up control node PU and the voltage of the output signal end OUT.

Optionally, the method for driving the shift register 400 shown in FIG. 4 may further comprises: inputting a second clock signal CLKB to the noise reduction module to turn on the noise reduction module, so that the input signal IN is provided to the pull-up control node PU; and providing the first voltage signal VSS to the output signal end OUT.

Figure 8:
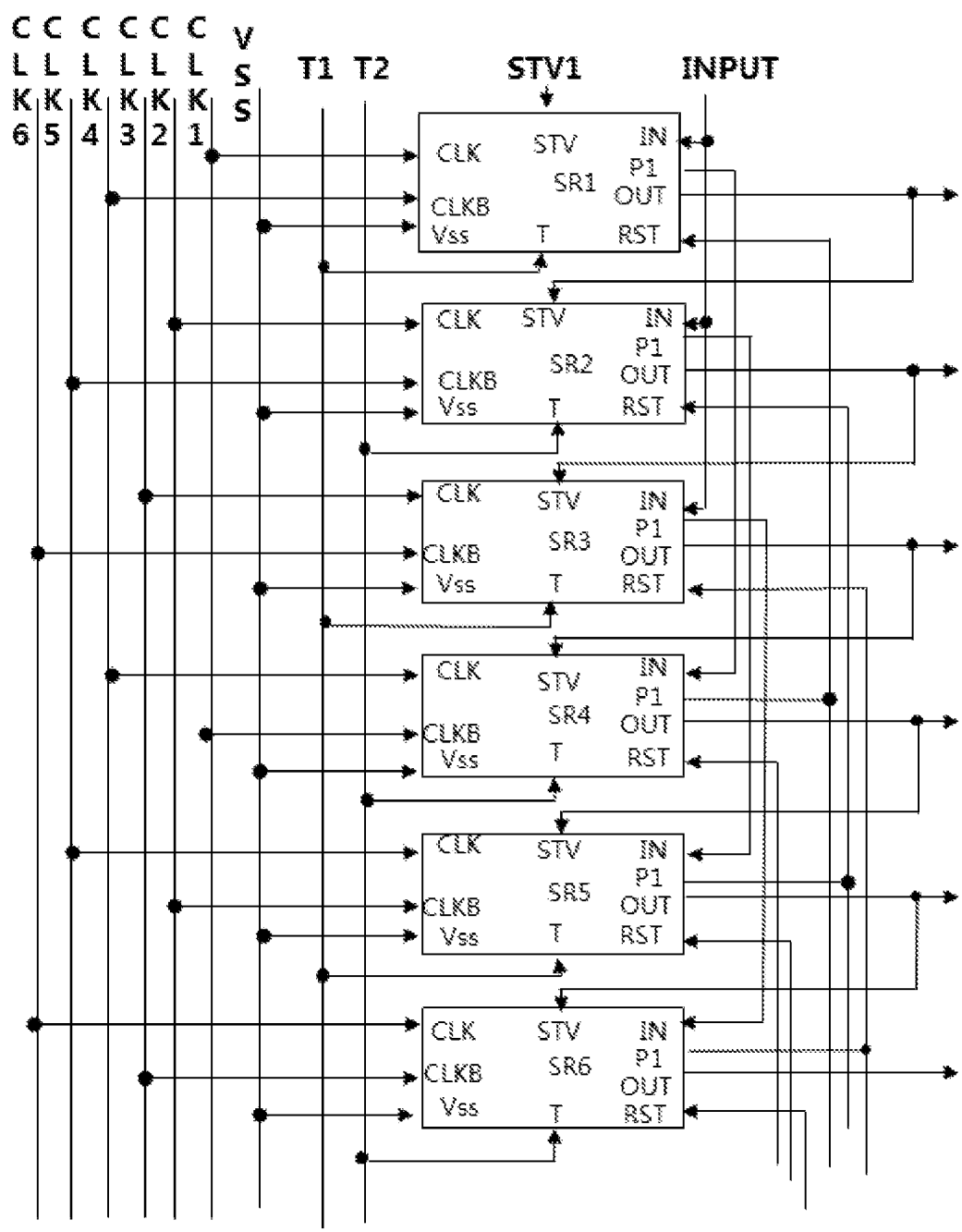
FIG. 8 shows a schematic view of a gate driving device using the shift register according to the embodiment of the present disclosure.

FIG. 8 shows a schematic block diagram of a gate driving device 800 according to an embodiment of the present disclosure. As shown in FIG. 8, the gate driving device 800 may comprise a plurality of shift registers shown in FIG. 4. Herein, only the first 6 shift registers SR1 to SR6 are illustrated as an example, which are divided into two shift register stages, the first shift register stage including 3 shift registers SR1 to SR3, and the second shift register stage including 3 shift registers SR4 to SR6. In the embodiment of the present disclosure, the signal-dot inversion driving mode is used, precharging is performed on three rows and AC clock signals are used.

In the gate driving device 800, each shift register SR may comprise the follows ports: an input signal end IN, a reset signal end RST, a first voltage signal end VSS, a first clock signal input end CLK, a second clock signal input end CLKB, an output signal end OUT, a cascade node P1, a control signal end T and a start signal input end STV.

The start signal input end STV of the first shift register SR1 is connected to an initial start signal STV1, the start signal input end STV of other shift register is connected to the output signal end OUT of a previous shift register. Different from the gate driving device discussed in FIG. 3, all the shift registers of the gate driving device 800 do not receive a start signal using their input signal end IN, instead, an output signal outputted from the output signal end OUT of a previous shift register is received using the start signal input end STV. For example, refer to FIG. 8, a STV signal is received at the STV end of the shift register SR1, and the STV ends of the shift registers SR2-SR6 are connected to the OUT ends of SR1-SR5 respectively.

The cascade node P1 of the jth (j=1, 2 or 3) shift register at the first shift register stage is connected to the IN end of the corresponding jth shift register at the second shift register stage. The cascade node P1 of the jth shift register at other shift register stage is connected to the RST end of the corresponding jth shift register at a previous shift register stage and is connected to the IN end of the corresponding jth shift register at a next shift register stage. The IN end of each shift register (SR1-SR3) at the first shift register stage is connected to the input signal IN. Refer to FIG. 8, for example, the cascade nodes P1 of shift register SR1-SR3 at the first shift register stage are connected to the IN ends of shift registers SR4-SR6 at the second shift register stage respectively, the cascade nodes P1 of shift register SR4-SR6 are connected to the RST ends of shift registers SR1-SR3 respectively and are connected to the IN ends (not shown) of shift registers SR7-SR9 at the third shift register stage respectively. The IN ends of shift registers SR1-SR3 are connected to the input signal IN.

The first clock signal input end CLK of the jth shift register at each shift register stage is connected to the second clock signal input end CLKB of the jth shift register at an adjacent shift register stage. Refer to FIG. 8, for example, the first clock signal end CLK of the shift register SR1 and the second clock signal end CLKB of the shift register SR4 are connected to the CLK1 signal respectively, the first clock signal end CLK of the shift register SR2 and the second clock signal end CLKB of the shift register SR3 are connected to the CLK2 signal respectively, the first clock signal end CLK of the shift register 3 and the second clock signal end CLKB of the shift register SR6 are connected to the CLK3 signal respectively, the first clock signal end CLK of the shift register SR4 and the second clock signal end CLKB of the shift register SR1 are connected to the CLK4 signal respectively, the first clock signal end CLK of the shift register SR5 and the second clock signal end CLKB of the shift register SR2 are connected to the CLK5 signal respectively, the first clock signal end CLK of the shift register 6 and the second clock signal end CLKB of the shift register SR1 are connected to the CLK6 signal respectively.

In the embodiment of the present disclosure, the first clock signal CLK and the second clock signal CLKB of each shift register have the same signal cycle but opposite phases. In the present embodiment, the phase difference between CLK2 and CLK1 may be ⅙ cycle, and the phase difference between CLK3 and CLK1 may be ⅓ cycle. In the case of precharging M rows, the phase difference between the first clock signals CLK of adjacent shift registers at the same shift register stage may be ½M cycle. Other phase differences can be selected as required. A duty cycle of 50% or other values can be selected for CLK and CLKB.

The control signal end T of the (2i−1)th shift register (i is a natural number) is connected to the (2i−1)th control signal $(T_{2i-1})$, and control signal end T of the (2i)th shift register is connected to the the (2i)th control signal $(T_{2i-1})$, i.e., shift registers in odd and even rows have different control signals T respectively. As for interlaced scanning in the signal-dot inversion driving mode, all odd rows have the same control signal, and all even rows have the same control signal. Refer to FIG. 8, for example, the T ends of the shift registers in the odd rows are connected to a first control signal T1, and the T ends of the shift registers in the even rows are connected to a second control signal T2. That is, the T1 signal is inputted to the T ends of the shift registers SR1, SR3 and SR5, and the T2 signal is inputted to the T ends of the shift registers SR2, SR4 and SR6.

The first voltage signal end VSS of each shift register is connected to the VSS signal.

Figure 9:
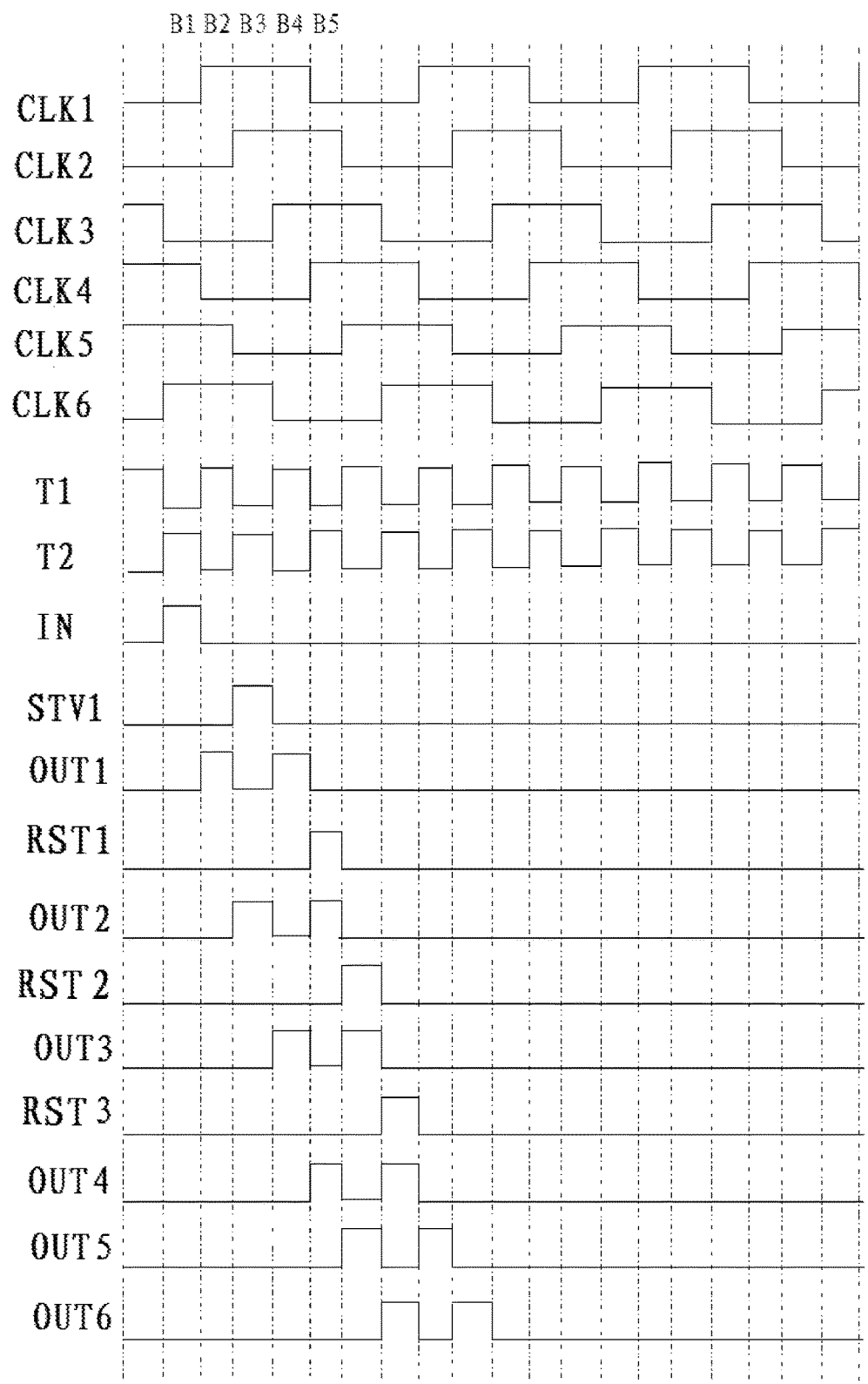
FIG. 9 shows a timing diagram of various signals of the gate driving device shown in FIG. 8.

FIG. 9 shows a timing diagram for driving the gate driving device 800 shown in FIG. 8.

During time period B1 (input phase of shift register SR1), high voltage level signals are provided to the second clock signal input ends CLKB of shift registers SR1-SR3 at the first shift register stage, high voltage level signals are provided to the input signal ends IN of shift registers SR1-SR3, so that the output signal ends OUT of shift registers SR1-SR3 output low voltage level signals. Low voltage level signals are provided to the first clock signal input ends CLK of shift registers SR1-SR3, thereby the voltages of their cascade nodes P1 are at a low voltage level to provide low voltage level signals to the input signal ends of shift registers SR4-SR6.

During time period B2 (precharging phase of shift register SR1), a CLK1 signal at a high voltage level is provided to the first clock signal input end CLK of the first shift register SR1, so that the voltage of its cascade node P1 is at a high voltage level, and thus the input signal at the input signal end IN of the fourth shift register SR4 (i.e., the first shift register at the second shift register stage) is at a high voltage level. A T1 signal at a high voltage level is provided to the control signal end T of the first shift register SR1, so that its output signal end OUT outputs an OUT1 signal at a high voltage level, thereby the start signal of the second shift register SR2 is at a high voltage level. High voltage level signals are provided to the second clock signal input end CLKB of shift registers SR2-SR4, thereby the output signal ends OUT of shift registers SR2-SR4 output low voltage level signals.

During time period B3 (first reset phase of shift register SR1), a STV1 signal at a high voltage level is provided to the start signal input end STV of the first shift register SR1, so that its output signal end OUT outputs an OUT1 signal at a low voltage level, and thus the start signal of the second shift register SR2 is at a low voltage level. CLK1 and CLK2 signals at a high voltage level are provided to the first clock signal input ends CLK of the first and second shift registers SR1-SR2 at the first shift register stage respectively, the cascade nodes P1 of shift registers SR1-SR2 have voltages at a high voltage level, and the input signals at the input signal ends IN of shift registers SR4-SR5 (i.e., the first and second shift registers at the second shift register stage) are at a high voltage level. A T2 signal at a high voltage level is provided to the control signal end T of the second shift register SR2, so that its output signal end OUT outputs an OUT2 signal at a high voltage level, thereby the start signal of the third shift register SR3 is at a high voltage level. High voltage level signals are provided to the second clock signal input ends CLKB of shift registers SR3-SR5, thereby the output signal ends OUT of shift registers SR3-SR5 output low voltage level signals.

During time period B4 (pixel writing phase of shift register SR1), CLK1-CLK3 signals at a high voltage level are provided to the first clock signal input ends CLK of the first to third shift registers SR1-SR3 at the first shift register stage respectively, the voltages of the cascade nodes P1 of shift registers SR1-SR3 become at a high voltage level, and the input signals at the input signal ends IN of shift registers SR4-SR6 (i.e., the first and third shift registers at the second shift register stage) become at a high voltage level. T1 signals at a high voltage level are provided to the control signal ends T of shift registers SR1 and SR3, so that the output signal ends OUT of shift registers SR1 and SR3 output OUT1 and OUT3 signals at a high voltage level, thereby the start signals of shift registers SR2 and SR4 are at a high voltage level, and the output signal ends OUT of shift registers SR2 and SR4 output OUT2 and OUT4 signals at a low voltage level. High voltage level signals are provided to the second clock signal input ends CLKB of shift registers SR4-SR6, thereby the output signal ends OUT of shift registers SR4-SR6 output low voltage level signals OUT4-OUT6.

During time period B5 (second reset phase of shift register SR1), CLK2-CLK4 signals at a high voltage level are provided to the first clock signal input ends CLK of shift registers SR2-SR4 respectively, the voltages of the cascade nodes P1 of shift registers SR2-SR4 become at a high voltage level. The high voltage level signal at the cascade node P1 of shift register SR4 is provided to the reset signal end RST of shift register SR1, so that the reset signal of shift register SR1 is at a high voltage level, and thereby the output signal end OUT of shift register SR1 outputs an OUT1 signal at a low voltage level. T2 signals at a high voltage level are provided to the control signal ends T of shift registers SR2 and SR4, so that the output signal ends OUT of shift registers SR2 and SR4 output OUT2 and OUT4 signals at a high voltage level, thereby the start signals of shift registers SR3 and SR5 are at a high voltage level, and the output signal ends OUT of shift registers SR3 and SR5 output OUT3 and OUT5 signals at a low voltage level. A high voltage level signal is provided to the second clock signal input end CLKB of shift register SR6, thereby the output signal end OUT of shift register SR6 outputs a low voltage level signal OUT6.

To this point, the driving timing sequence of shift register SR1 is complete, after which other shift registers SR2, SR3 continue to complete their operation processes in a similar manner, particularly as shown in FIG. 9, which will not be repeated herein.

In the embodiment of the present disclosure, during the pixel writing phase, if pixel writing is currently performed on an odd row of display elements, precharging is performed on a subsequent odd row of display elements; if pixel writing is currently performed on an even row of display elements, precharging is performed on a subsequent even row of display elements. The cascade node P1 is connected to the reset signal end RST of a corresponding shift register at a previous shift register stage and is connected to the input signal end IN of a corresponding shift register at a next shift register stage, to guarantee a sufficient pull-up period for the voltage of the pull-up node PU of the shift register.

Figure 10:
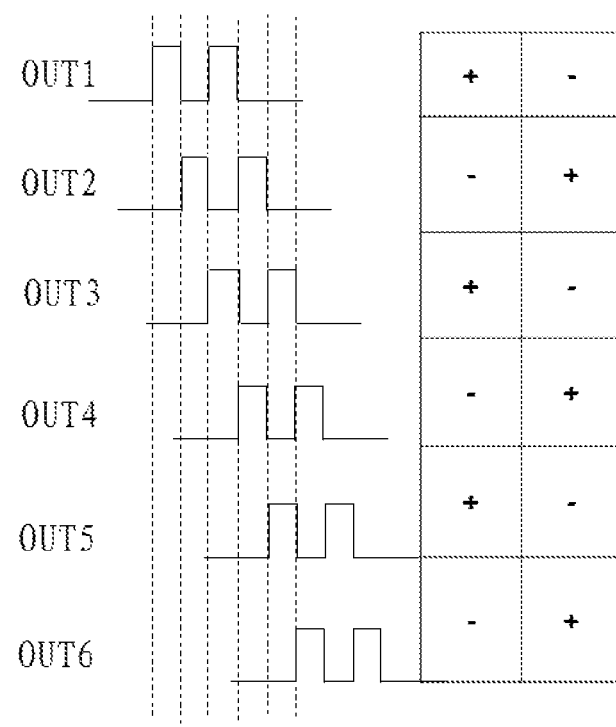
FIG. 10 is a view showing the effect of pixel charging of the gate driving device in FIG. 8.

FIG. 10 is a view showing the effect of pixel charging according to the gate driving device in FIG. 8 and the driving timing sequence shown in FIG. 9. As shown in FIG. 10, the first and third rows of pixels have the same polarity "+", the third row starts to precharge when the first row of pixels is written; the second and fourth rows of pixels have the same polarity "−", and the fourth row starts to precharge when the second row of pixels is written. Thereby, like-polarity precharging can be implemented for both of odd rows and even rows, which can reduce the power consumption of precharging, and can prevent a difference in charging of odd and even rows, thus the quality of images can be improved.

According to the embodiment of the present disclosure, the single-dot inversion driving mode is not limited to the above mode, and the gate driving device can also be extended to 2dot inversion driving and 2+1dot inversion driving mode, etc. For these multi-dot inversion driving modes, the key is to change the input method of the control signal T.

Figure 11:
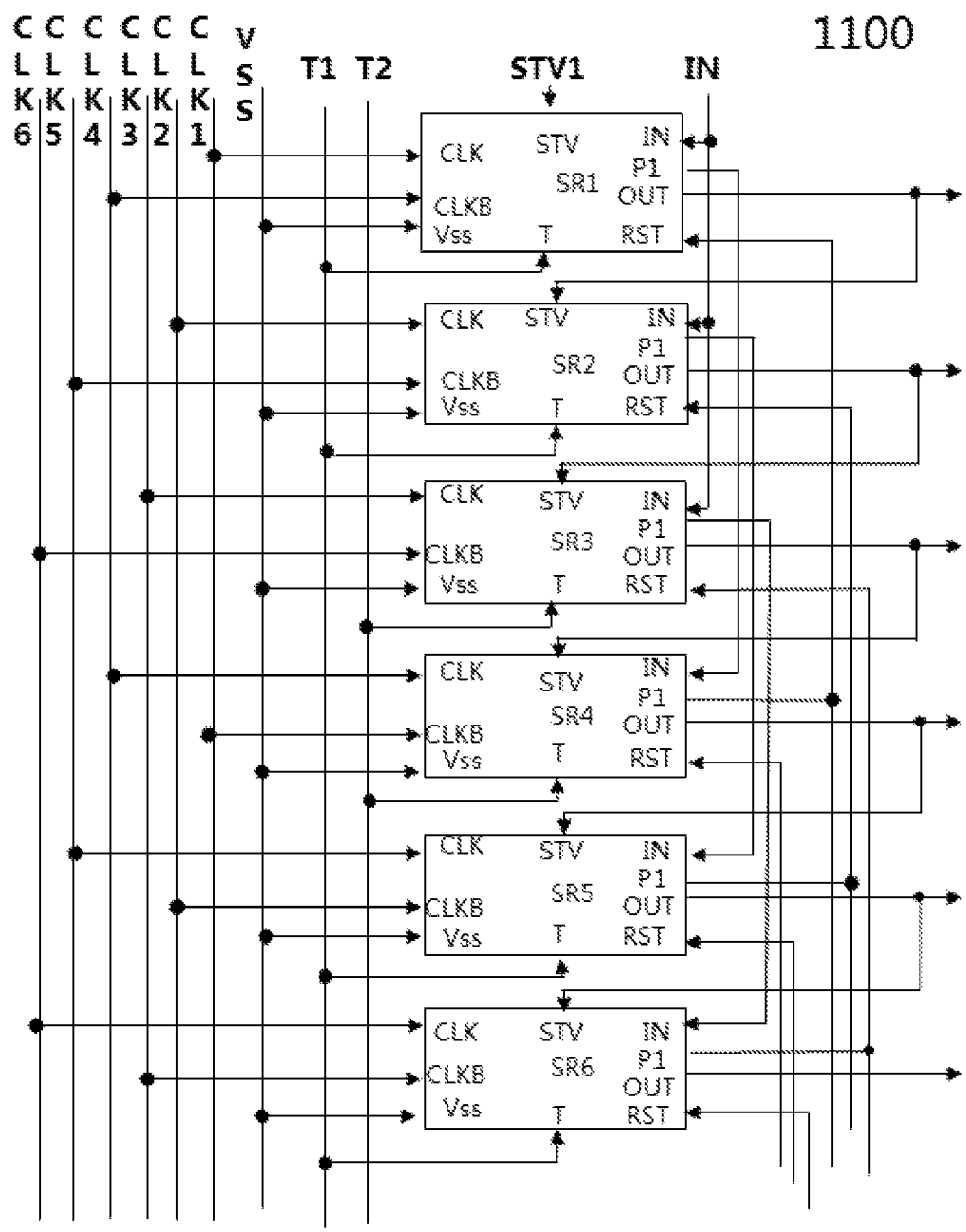
FIG. 11 shows a schematic view of a gate driving device according to another embodiment of the present disclosure.

FIG. 11 shows a schematic block diagram of a gate driving device 1100 in the 2dot inversion driving mode according to an embodiment of the present disclosure. As shown in FIG. 11, the T ends of the (2i−1)th and (2i)th shift registers are connected to the (2i−1)th and (2i)th control signals ($T_{2i-1}$ and $T_{2i}$, or T1 in the case of the same control signal), and the T ends of the (2i+1)th and (2i+2)th shift registers are connected to the (2i+1)th and (2i+2)th control signals ($T_{2i+1}$ and $T_{2i+2}$, or T2 in the case of the same control signal).

Figure 12:
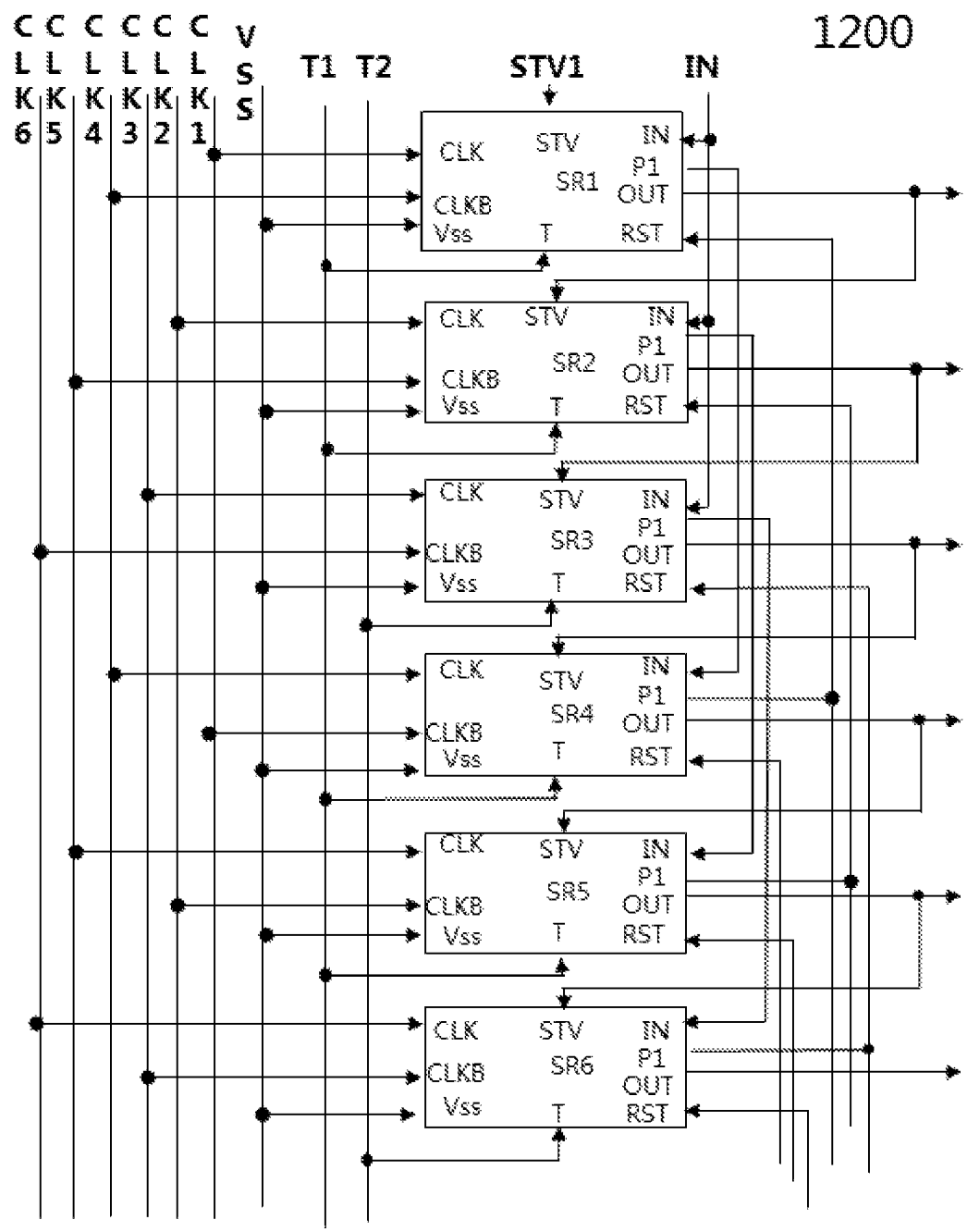
FIG. 12 shows a schematic view of a gate driving device according to another embodiment of the present disclosure.

FIG. 12 shows a schematic block diagram of a gate driving device 1200 in the 2+1dot inversion driving mode according to an embodiment of the present disclosure. As shown in FIG. 12, the T ends of the (3i−2)th, (3i−1)th, (3i+1)th and (3i+2)th shift registers are connected to the (3i−2)th, (3i−1)th, (3i+1)th, and (3i+2)th control signals ($T_{3i-2}$, $T_{3i-1}$, $T_{3i-1}$, and $T_{3i+2}$, or T1 in the case of the same control signal), and the T ends of the (3i)th and (3i+3))th shift registers are connected to the (3i)th and (3i+3))th control signals ($T_{3i}$ and $T_{3i+3}$, or T2 in the case of the same control signal).

In the embodiment of the present disclosure, DC signals can be used for the first clock signal CLK and the second clock signal CLKB of the shift register circuit for realizing DC noise reduction, or AC signals can be used for realizing AC noise reduction.

Figure 13:
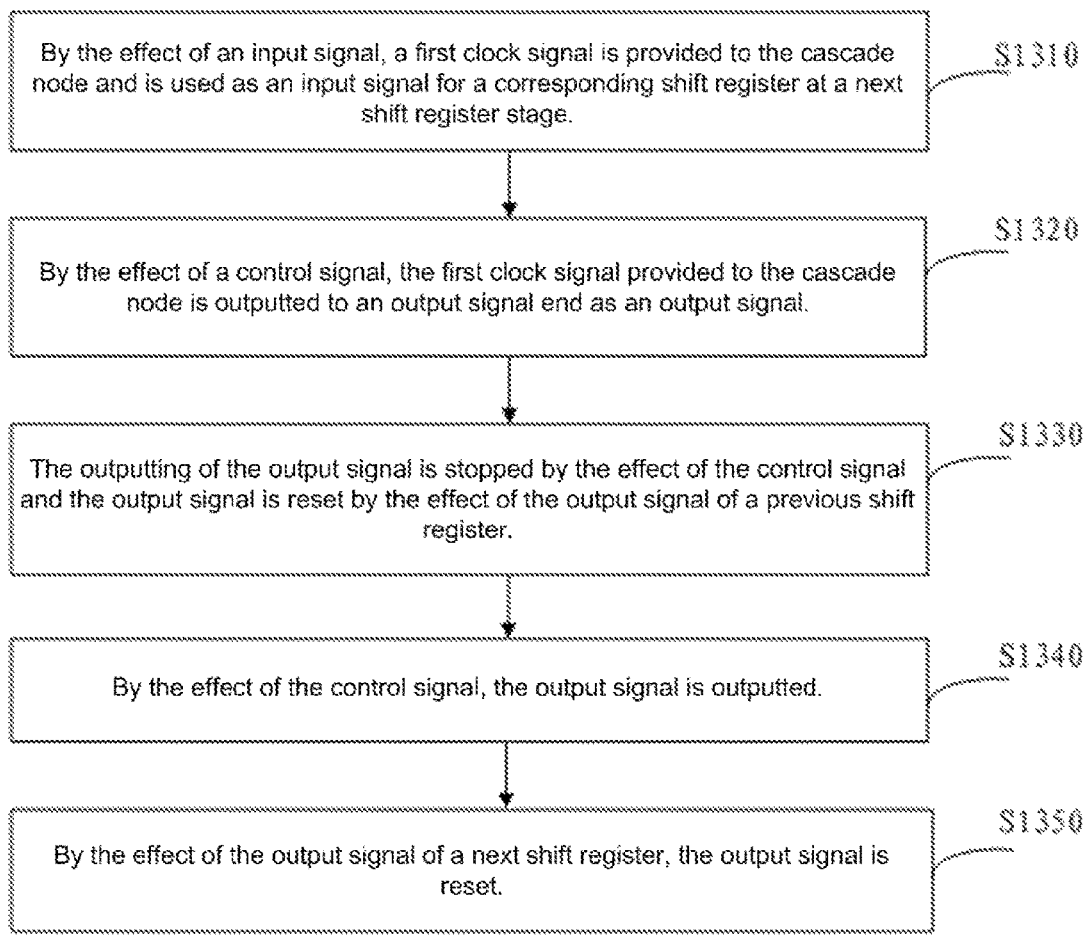
FIG. 13 shows an exemplary flowchart of a method for driving the gate driving device shown in FIG. 8.

FIG. 13 shows an exemplary flowchart of a method for driving the gate driving device 800 shown in FIG. 8 according to an embodiment of the present disclosure. In the embodiment of the present disclosure, a low voltage level signal is applied to the first voltage signal end VSS of each shift register of the gate driving device 800.

At step S1310, by the effect of an input signal INPUT, a first clock signal CLK is provided to the cascade node P1 and is used as an input signal for a corresponding shift register at a next shift register stage.

At step S1320, by the effect of a control signal T, the first clock signal CLK provided to the cascade node P1 is outputted to an output signal end OUT as an output signal OUT.

At step S1330, by the effect of the control signal T, the outputting of the output signal OUT is stopped and the output signal OUT is reset by the effect of a start signal STV (i.e., the output signal of a previous shift register).

At step S1340, by the effect of the control signal T, the output signal OUT is outputted.

At step S1350, by the effect of a reset signal RST (i.e., the output signal of a next shift register), the output signal OUT is reset.

When an odd numbered shift register is at step S1340, a subsequent odd numbered shift register is at step S1320, and when an even numbered shift register is at step S1340, a subsequent even numbered shift register is at step S1320.

According to the improved shift register, the gate driving device including the above shift register and its driving method described above, a control signal T is received by an output gating module to selectively output the output signal of a shift register, the output signal of a previous shift register is received by the output pull-down module, and the cascade node P1 is used to guarantee a correct timing, thereby the inconsistent brightness and horizontal stripes caused by a difference in charging between odd and even rows when precharging row-by-row by the gate driving device operating in the dot inversion driving mode are prevented, so that the power consumption of the source driving IC can be reduced and the quality of the products can be improved.

Those skilled in the art should appreciate that many modifications and substitutions can be made to the details of the present technical solution according to the disclosure and overall teaching of the present disclosure. Thus, the specific embodiments described in this description are merely illustrative and are not used for limiting the scope of the present disclosure. The present disclosure should be defined by the appended claims and any and all equivalents thereof.

What is claimed is:

1. A shift register, comprising:
   an input module coupled to an input signal end and a pull-up control node, and configured to, according to an input signal from the input signal end, provide the input signal to the pull-up control node;
   a reset module coupled to a reset signal end, a first voltage signal end and the pull-up control node, and configured to, according to a reset signal from the reset signal end, provide a first voltage signal from the first voltage signal end to the pull-up control node to reset a voltage of the pull-up control node;
   a pull-up module coupled to a first clock signal input end, the pull-up control node, an output signal end and a cascade node, and configured to, according to the voltage of the pull-up control node, provide a first clock signal from the first clock signal input end to the cascade node;
   a control module coupled to a second clock signal input end, the pull-up control node, a pull-down control node, and the first voltage signal end, and configured to, according to a second clock signal from the second clock signal input end and the voltage of the pull-up control node, control a voltage of the pull-down control node;
   a pull-down module coupled to the pull-up control node, the pull-down control node, the first voltage signal end and the output signal end, and configured to, according to the voltage of the pull-down control node, provide the first voltage signal from the first voltage signal end to the pull-up control node and the output signal end to reset the voltage of the pull-up control node and the voltage of the output signal end;
   an output gating module coupled to the cascade node, the output signal end and a control signal end, and configured to, according to a control signal from the control signal end, provide a voltage of the cascade node to the output signal end as an output signal; and
   an output pull-down module coupled to the first voltage signal end, a start signal input end and the output signal end, and configured to, according to a start signal from the start signal input end, provide the first voltage signal from the first voltage signal end to the output signal end;
   wherein the first clock signal and the second clock signal have opposite phases.

2. The shift register according to claim 1, wherein the input module comprises:
   a first transistor, wherein a first electrode and a control electrode of the first transistor are coupled to the input signal end, and a second electrode of the first transistor is coupled to the pull-up control node.

3. The shift register according to claim 1, wherein the reset module comprises:
   a second transistor, wherein a first electrode of the second transistor is coupled to the pull-up control node, a second electrode of the second transistor is coupled to the first voltage signal end, and a control electrode of the second transistor is coupled to the reset signal end.

4. The shift register according to claim 1, wherein the pull-up module comprises:
   a third transistor, wherein a first electrode of the third transistor is coupled to the first clock signal input end, a second electrode of the third transistor is coupled to the cascade node, and a control electrode of the third transistor is coupled to the pull-up control node; and
   a first capacitor coupled between the pull-up control node and the output signal end.

5. The shift register according to claim 1, wherein the control module comprises:
   a fourth transistor, wherein a first electrode and a control electrode of the fourth transistor are coupled to the second clock signal input end;
   a fifth transistor, wherein a first electrode of the fifth transistor is coupled to the second clock signal input end, a second electrode of the fifth transistor is coupled to the pull-down control node, and a control electrode of the fifth transistor is coupled to a second electrode of the fourth transistor;
   a sixth transistor, wherein a first electrode of the sixth transistor is coupled to the pull-down control node, a second electrode of the sixth transistor is coupled to the first voltage signal end, and a control electrode of the sixth transistor is coupled to the pull-up control node;
   a seventh transistor, wherein a first electrode of the seventh transistor is coupled to the second electrode of the fourth transistor, a second electrode of the seventh transistor is coupled to the first voltage signal end, and a control electrode of the seventh transistor is coupled to the pull-up control node.

6. The shift register according to claim 1, wherein the pull-down module comprises:
   an eighth transistor, wherein a first electrode of the eighth transistor is coupled to the pull-up control node, a second electrode of the eighth transistor is coupled to the first voltage signal end, and a control electrode of the eighth transistor is coupled to the pull-down control node; and
   a ninth transistor, wherein a first electrode of the ninth transistor is coupled to the output signal end, a second electrode of the ninth transistor is coupled to the first voltage signal end, and a control electrode of the ninth transistor is coupled to the pull-down control node.

7. The shift register according to claim 1, wherein the output gating module comprises:
 a tenth transistor, wherein a first electrode of the tenth transistor is coupled to the cascade node, a second electrode of the tenth transistor is coupled to the output signal end, and a control electrode of the tenth transistor is coupled to the control signal end.

8. The shift register according to claim 1, wherein the output pull-down module comprises:
 an eleventh transistor, wherein a first electrode of the eleventh transistor is coupled to the output signal end, a second electrode of the eleventh transistor is coupled to the first voltage signal end, and a control electrode of the eleventh transistor is coupled to the start signal input end.

9. The shift register according to claim 1, further comprising a noise reduction module coupled to the second clock signal input end, the input signal end, the first voltage signal end and the output signal end, and configured to, according to the second clock signal from the second clock signal input end, provide the input signal from the input signal end to the pull-up control node, and provide the first voltage signal from the first voltage signal end to the output signal end.

10. The shift register according to claim 9, wherein noise reduction module comprises:
 a twelfth transistor, wherein a first electrode of the twelfth transistor is coupled to the output signal end, a second electrode of the twelfth transistor is coupled to the first voltage signal end, and a control electrode of the twelfth transistor is coupled to the second clock signal input end; and
 a thirteenth transistor, wherein a first electrode of the thirteenth transistor is coupled to the input signal end, a second electrode of the thirteenth transistor is coupled to the pull-up control node, and a control electrode of the thirteenth transistor is coupled to the second clock signal input end.

11. A method for driving the shift register according to claim 1, comprising:
 during a first time period, providing the input signal to the input module to turn on the input module, outputting the input signal to the pull-up control node, turning on the pull-up module according to the voltage of the pull-up control node, providing the first clock signal to the cascade node, and turning on the control module according to the voltage of the pull-up control node and the second clock signal to control the voltage of a pull-down control node;
 during a second time period, keeping the pull-up module in a turn-on state and providing the control signal to the output gating module to turn on the output gating module and outputting the first clock signal provided to the cascade node to the output signal end;
 during a third time period, providing the start signal to the output pull-down module to turn on the pull-down module and outputting the first voltage signal to the output signal end to reset the voltage of the output signal end;
 during a fourth time period, turning on the pull-up module and the output gating module according to the voltage of the pull-up control node and the control signal and outputting the first clock signal to the output signal end;
 during a fifth time period, providing the reset signal to the reset module to turn on the reset module, providing the first voltage signal to the pull-up control node, and controlling the voltage of the pull-down control node by the control module to turn on the pull-down module, providing the first voltage signal to the pull-up control node and the output signal end, so that the voltage of the pull-up control node and the voltage of the output signal end are reset.

12. The method according to claim 11, further comprising:
 during the first time period and the fifth time period, inputting the second clock signal to a noise reduction module to turn on the noise reduction module, so that the input signal is provided to the pull-up control node and the first voltage signal is provided to the output signal end.

13. A gate driving device comprising a plurality of shift registers according to claim 1, wherein the plurality of shift registers are divided into N shift register stages, wherein each shift register stage comprises M shift registers,
 wherein a start signal input end of a first shift register of the plurality of shift registers, at a first shift register stage is connected to an initial start signal, and a start signal input end of each of others of the plurality of shift registers is coupled to an output signal end of a previous shift register;
 a cascade node of the jth shift register at the first shift register stage is coupled to an input signal end of a corresponding jth shift register at a second shift register stage, and a cascade node of the jth shift register at another shift register stage is coupled to a reset signal end of a corresponding jth shift register at a previous shift register stage and an input signal end of a corresponding jth shift register at a next shift register stage respectively, the input signal end of each shift register at the first shift register stage is connected to an input signal;
 a first clock signal input end of the jth shift register at each shift register stage is connected to a second clock signal input end of the jth shift register at an adjacent shift register stage;
 a control signal end of the (2i−1)th shift register is connected to a first control signal, and a control signal end of the (2i)th shift register is connected to a second control signal;
 a first voltage signal end of each shift register is connected to the first voltage signal.

14. A gate driving device comprising a plurality of shift registers according to claim 1, wherein the plurality of shift registers are divided into N shift register stages, wherein each shift register stage comprises M shift registers,
 wherein a start signal input end of a first shift register of the plurality of shift registers, at a first shift register stage is connected to an initial start signal, and a start signal input end of each of others of the plurality of shift registers is coupled to an output signal end of a previous shift register;
 a cascade node of the jth shift register at the first shift register stage is coupled to an input signal end of a corresponding jth shift register at a second shift register stage, and a cascade node of the jth shift register at another shift register stage is coupled to a reset signal end of a corresponding jth shift register at a previous shift register stage and an input signal end of a corresponding jth shift register at a next shift register stage respectively, the input signal end of each shift register at the first shift register stage is connected to an input signal;

a first clock signal input end of the jth shift register at each shift register stage is connected to a second clock signal input end of the jth shift register at an adjacent shift register stage;

the control signal ends of the (2i−1)th and (2i)th shift registers are connected to a first control signal, and control signal ends of the (2i+1)th and (2i+2)th shift registers are connected to a second control signal;

a first voltage signal end of each shift register is connected to the first voltage signal.

15. A gate driving device comprising a plurality of shift registers according to claim 1, wherein the plurality of shift registers are divided into N shift register stages, wherein each shift register stage comprises M shift registers, wherein a start signal input end of a first shift register of the plurality of shift registers, at a first shift register stage is connected to an initial start signal, and a start signal input end of each of others of the plurality of shift registers is coupled to an output signal end of a previous shift register;

a cascade node of the jth shift register at the first shift register stage is coupled to an input signal end of a corresponding jth shift register at a second shift register stage, and a cascade node of the jth shift register at another shift register stage is coupled to a reset signal end of a corresponding jth shift register at a previous shift register stage and an input signal end of a corresponding jth shift register at a next shift register stage respectively, the input signal end of each shift register at the first shift register stage is connected to an input signal;

a first clock signal input end of the jth shift register at each shift register stage is connected to a second clock signal input end of the jth shift register at an adjacent shift register stage;

control signal ends of the (3i−2)th, (3i−1)th, (3i+1)th and (3i+2)th shift registers are connected to a first control signal, and control signal ends of the (3i)th and (3i+3)th shift registers are connected to a second control signal;

a first voltage signal end of each shift register is connected to the first voltage signal.

16. The gate driving device according to claim 13, wherein the first clock signal and the second clock signal are DC signals.

17. The gate driving device according to claim 13, wherein the first clock signal and the second clock signal are AC signals.

18. A display device including the shift register according to claim 1.

19. A display device including the gate driving device according to claim 13.

20. A method for driving the gate driving device according to claim 13, comprising:

during a first time period, by an effect of an input signal, providing the first clock signal to an cascade node and using the first clock signal as an input signal for a corresponding shift register at a next shift register stage;

during a second time period, by an effect of a control signal, outputting the first clock signal provided to the cascade node to an output signal end as an output signal;

during a third time period, stopping the outputting of the output signal by action of the control signal and resetting the output signal by an effect of an output signal of a previous shift register;

during a fourth time period, outputting the output signal by an effect of the control signal;

during a fifth time period, resetting the output signal by an effect of an output signal of a next shift register;

wherein, when an odd numbered shift register is in the fourth time period, a subsequent odd numbered shift register is in the second time period, and when an even numbered shift register is in the fourth time period, a subsequent even numbered shift register is in the second time period.

* * * * *